United States Patent [19]

Woodall

[11] 4,316,048
[45] Feb. 16, 1982

[54] ENERGY CONVERSION

[75] Inventor: Jerry M. Woodall, Bedford Hills, N.Y.

[73] Assignee: International Business Machines Corporation, Armonk, N.Y.

[21] Appl. No.: 161,982

[22] Filed: Jun. 20, 1980

[51] Int. Cl.³ .......................................... H01L 31/04
[52] U.S. Cl. ................................. 136/253; 126/436; 126/441
[58] Field of Search ................ 136/253, 257; 126/417, 126/419, 420, 436, 441

[56] References Cited

U.S. PATENT DOCUMENTS

| | | | |
|---|---|---|---|
| 3,331,707 | 7/1967 | Werth | 136/253 |
| 3,331,707 | 7/1967 | Werth | 136/253 |
| 3,433,676 | 3/1969 | Stein | 136/253 |
| 3,751,303 | 8/1973 | Kittl | 136/253 |
| 3,929,510 | 12/1975 | Kittl | 136/247 |
| 3,946,720 | 3/1976 | Keyes et al. | 126/418 |
| 4,026,267 | 5/1977 | Coleman | 126/436 |
| 4,090,359 | 5/1978 | Doellner | 60/39.69 R |
| 4,111,189 | 9/1978 | Dizon | 126/400 |
| 4,131,158 | 12/1978 | Abhat et al. | 165/104 S |

OTHER PUBLICATIONS

I. Meingaillis et al., "Photovoltaic Solar Energy Conversion Using High-Temperature Thermal Reservoirs", NSF Document No. NSE-RAHN-74-013, pp. 269-274.
A. B. Meinel et al., "Applied Solar Energy", Addison-Wesley Pub. Co. (1976), pp. 468-469.
G. D. Pettit et al., "Solar Absorbing Surfaces of Anodized Dendritic Tungsten", IBM J. Res. Development, vol. 22, pp. 372-377 (1978).
R. L. Bell, "Concentration Ratio & Efficiency in Thermophotovoltaics", Solar Energy, vol. 23, pp. 203-210 (1979).
P. Wurfel et al., "Upper Limit of Thermophotovoltaic Solar Energy Conversion", IEEE Trans. Electron Devices, vol. ED-27, pp. 745-750 (Apr. 1980).
T. I. Chappell, "The V-Groove Multijunction Solar Cell", IEEE Trans. Electron Devices, vol. ED-26, pp. 1091-1097 (1979).
J. A. Duffie et al., "Solar Energy Thermal Processes", J. Wiley and Sons, New York, pp. 231-235.

Primary Examiner—Aaron Weisstuch
Attorney, Agent, or Firm—Alvin J. Riddles

[57] ABSTRACT

Energy conversion capable of receiving input energy in thermal or radiant form at a variable rate and releasing energy in thermal, radiant or electrical form independent of rate is accomplished by providing a buffer member of a material that has three criteria, a melting temperature above 1300° K., a thermal conductance greater than 0.1 in calories per square centimeter per centimeter per degree per second and a latent heat of fusion of the order of 1 kilocalorie per mole. The converter can absorb energy of multiple types, store it and then release it in a form compatible with the prospective use. Sunlight of daylight duration and varying intensity is converted to steady 24 hour a day electrical output.

19 Claims, 4 Drawing Figures

ENERGY CONVERSION

TECHNICAL FIELD

The technical field of the invention is that of the conversion of energy and of load leveling of energy availability. Energy available in varying intensity and duration is frequently desired for use in a different form and at a different rate. It is particularly useful in steady electrical form but at this state of the art conversion capability is limited. The major radiant energy source is the sun which emits a broad band of wavelengths but is of intermittent duration. Other sources such as industrial operations may have radiant energy and thermal energy available as by-products. Such sources usually have narrower bands and different durations and wavelengths. Most thermal energy utilization operations such as space heating have excess capacity and losses that could be captured in another energy form.

BACKGROUND ART

The desirability of energy storage for load leveling purposes has been set forth in *Solar Energy Thermal Processes*, published by Wiley, New York, pages 231 to 235, wherein current techniques such as using the latent heat of melting of salts are seen to be limited by the amount of energy that can be stored and by the rate at which it can be removed.

An effective method of using radiant or thermal energy is through conversion to electrical energy. At this state of the art, however, there is substantial room for improvement in the conversion efficiency. Further, the generally varying intensity and intermittent nature of the sources are usually incompatible with most electrical energy applications and distribution systems which usually require a steady supply.

The improvement efforts in conversion to electrical energy of the radiant energy sources such as sunlight and fuel burning cells using a photoelectric converter, primarily involve sophisticated solid state physics efforts at improving the wavelength range and overall efficiency of the photovoltaic cell. It is well known at this state of the art that a p-n homojunction photovoltaic solar cell has a limit conversion efficiency of about 26% for converting sunlight, which is a broad band radiation source, into electricity and much room for improvement is available with such devices.

There have been some other efforts in the art to convert radiant energy to steady electrical energy.

U.S. Pat. No. 3,929,510 for solar energy conversion teaches the use of a rare earth metal converter before the photovoltaic cell to improve the spectral match. U.S. Pat. Nos. 3,433,676 and 4,090,359 for industrial energy conversion have been directed to the conversion of energy from continuous heat sources such as a jet engine and flame source to improve efficiency of the electrical output.

DISCLOSURE OF THE INVENTION

Figure 1:
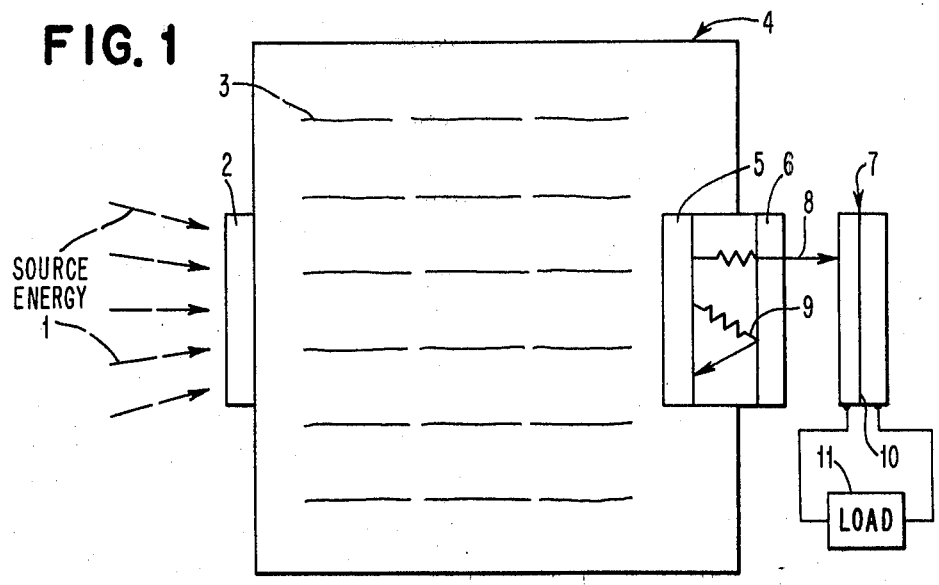
FIG. 1 is a schematic of the elements of the energy conversion device of the invention.

The invention involves energy conversion by retention of thermal energy supplied directly or by concentrated radiant energy in a material having the properties of a high thermal conductance, a high melting point and a high latent heat of fusion for release to a load.

In conversion of the energy to electrical energy only as much of the energy in a closely controlled form as a photovoltaic cell can convert with high efficiency is released. The energy is captured and stored with minimum loss and is then released at a possibly continuous rate to a photovoltaic cell using a combination of a thermal to radiant energy directional emitter and a band pass filter which together operate to permit only a certain range of photon energies to which a photovoltaic cell can efficiently respond, to be emitted. The system of the invention takes any source of radiant or thermal energy, either continuous or intermittent, at whatever intensity or rate, and collects the energy for storage in a material having the three properties in combination of a high thermal conductance, a high melting point and a high latent heat of fusion. Such a material will melt at a constant temperature during the absorption of energy and will freeze at the same constant temperature during the emission of energy. The material serves as a buffer and is provided with efficient thermal encapsulation so that the stored thermal energy can be retained for long periods and the thermal energy can be released at a rate independent of the input.

The storage material of the invention has three properties that provide the response and each of those properties has a value that is related to practicability.

The material has a high latent heat of fusion which provides the capability to store large quantities of energy. It thus has a high energy density which provides a large amount of energy storage per unit weight or volume. Further, the smaller volume permits lower energy loss due to a smaller surface area. It has been found that a latent heat of fusion value of above 1 kilocalories per mole is in a useful range.

The material has a high thermal conductance which is a measure of the ability to withdraw the heat that has been stored. It has been found that a thermal conductance of higher than 0.1 calories per square centimeter per centimeter per degree per second is in a useful range.

The material has a high melting point which provides in the molten condition a black body radiation wavelength distribution that is somewhat narrower and more compatible with the responsiveness of the loads which will be using the energy. The melting point should be within a uniform defined range as the temperature is cycled. A melting point above the vicinity of 1300° K. is in a useful range. Some example materials that satisfy the criteria very satisfactorily are iron, silicon, manganese, chromium, and titanium.

There are some practical aspects to the selection of the storage material in that it should not be unduly rare or costly and this in turn will be sensitive to a particular point in time. An illustration would be the element silver which has a very high thermal conductance of 1 calorie per $cm^2$ per cm per degree per second, a latent heat of fusion of 2.7 kilocalories per mole and a melting temperature of 920° C. so that it would appear to satisfy all criteria very well. It is, however, not a very plentiful material and it has been undergoing a wide range of costs from $2.00 to $60.00 per ounce over about a five year period so that for this reason, at the point in time of this writing, silver would have practical but not technical disadvantages.

Figure 2:
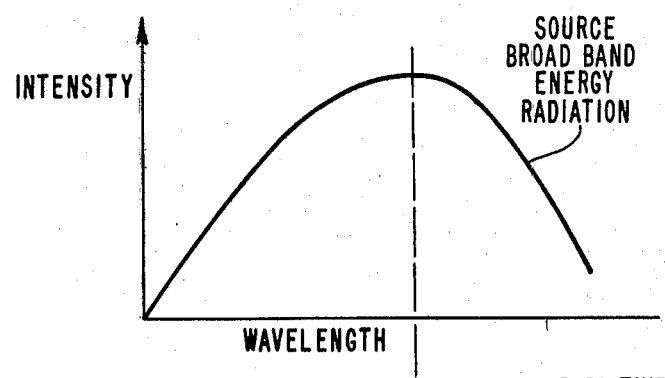
FIG. 2 is a graph of the broad band wavelength of radiant energy.

Referring to FIG. 1, a schematic diagram of the elements of the invention is provided. In FIG. 1 a source of energy 1 such as heat or radiant energy having a broad wavelength band as shown in FIG. 2, strikes an absorber 2. The absorber 2 which may be a broad band photothermal converter for radiant energy or a good thermal transfer member for heat, transfers the energy to an energy storage material 3. The absorber 2 in the case of radiant energy will include a concentrator to insure that the temperature of the input radiation exceeds that of the material 3.

The storage material 3 will melt at a constant temperature when the rate of absorption of energy through the absorber 2 is greater than the rate of emission of energy from the storage member 3 out of an opening in the container 4. Conversely the material 3 will solidify at the same constant temperature when the rate of emission is greater than the rate of absorption.

The material 3 is encased in an efficient heat retaining housing 4 to minimize loss. The housing 4 is designed to retain the energy in such a manner that only the portion selected for release is emitted. In the case of conversion to electrical energy the released portion is that which is useable by a particular photovoltaic device at high efficiency while supplying a specific load condition. This is accomplished in accordance with the invention by a combination of positioning in an opening in the housing 4 a directional thermal to radiant energy emitter 5, optically coupled to a radiant energy band pass filter 6 and both in turn are positioned for good optical coupling to a photovoltaic device 7. Each of elements 5, 6 and 7 have interdependent properties such that the directional emitter 5 converts the thermal energy stored in element 3 into radiant energy sufficiently directionally in a general sense that the band pass filter 6 can then permit only certain photons shown as arrow 8, the energy range of which is governed by the responsiveness of the photovoltaic device 7, to pass, while rejecting and turning back all other photons shown schematically as arrow 9. This structure provides a controlled release such that only the energy that can be efficiently used by a photovoltaic device 7 is permitted to escape and the storage member 3 continues to retain all unused energy. The photovoltaic device 7 has a photovoltaic junction 10 across which a load 11 is connected.

The interdependent properties of the emitter 5, the filter 6 and the photovoltaic cell 7 are selectable such that while the source of the energy stored may vary in intensity and be intermittent, the energy that is emitted is steady and is optimized with respect to the performance of the photovoltaic device 7 and to the load 11 condition.

Figure 3:
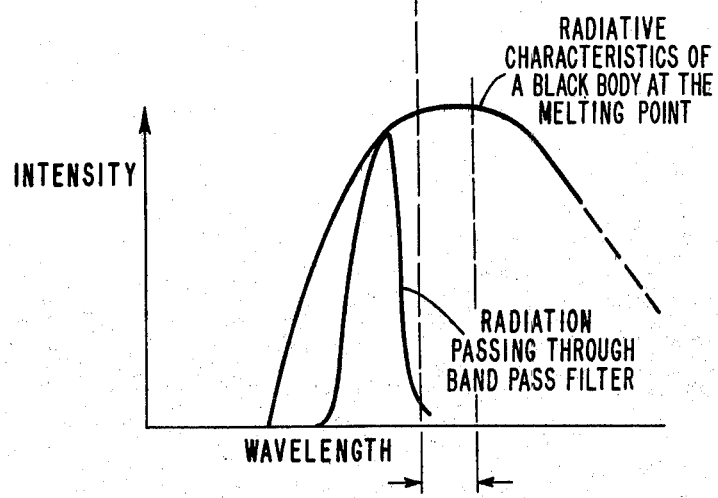
FIG. 3 is a graph correlated with FIG. 2 showing the characteristic black body radiation of material with a high latent heat of fusion, high thermal conductance and a high melting point at melting point, and the relationship between the characteristics of FIGS. 2 and 3 and the narrower wavelength band to which a photovoltaic cell is responsive.

The overall structure of the invention operates in combination to provide a closer energy matching by, in a first stage, absorbing the broad band energy radiation as shown in FIG. 2, and, as the material 3 reaches the molten stage, converting the radiative characteristics to a different distribution as shown in FIG. 3. The distribution of FIG. 3 has a peak wavelength that is larger than FIG. 2 and the distribution is offset as shown in the separation of the lines approximating the center of the distribution. In a second stage the structure of elements 5 and 6 only permit release of a narrow distribution as shown by the curve in FIG. 3 and further have the properties that the center of that narrower distribution can be moved to correspond to precise responsiveness specifications of the photovoltaic device 7. The narrower distribution can not only be adjusted in width but also the peak can be adjusted.

While radiation will take place from the material 3 when energy is stored in it both below and above the melting temperature, the most advantageous situation occurs at latent heat transfers such as at the melting temperature where at constant temperature all the latent heat of fusion can be stored until all the material 3 is molten and all the latent heat of fusion can be released until the material 3 is solid with the material 3 radiating with the characteristics of FIG. 3 at a constant temperature.

Where the stored thermal energy in the material 3 is to be transferred as thermal energy to a heat using load, an opening such as that occupied by elements 5 and 6 in the housing 4 would be fitted with a thermal converter. The ability, in accordance with the invention, to store energy from either radiant or thermal sources independent of intensity or duration wherein the storage is in a material having high energy density via the high latent heat of fusion criterion, ease of removal via the high thermal conductance criterion and the predictable heat characteristic via the melting point criterion, operate to provide a more efficient system that has been seen heretofore in the art. The size is smaller, the heat can be transferred out more readily and the converter that uses the heat can be more efficiently designed since the heat is available under narrower specifications.

BEST MODE FOR CARRYING OUT THE INVENTION

In operation, referring to both FIGS. 1 and 2, energy having all or any portion thereof as a broad band of wavelengths of the type illustrated in FIG. 2 is introduced as 1 in FIG. 1, at the absorber 2. The absorber is equipped with the property that it provides maximum thermal transfer to the storage material 3. In the case of energy 1 in the form of heat the absorber 2 will have good thermal conductivity, and in the case of the energy 1 being radiant energy, the absorber 2 will provide wavelength independent photothermal absorption. The purpose of the absorber 2 is that the maximum amount of energy is extracted from the source energy 1 and is transferred to the storage material 3. The absorber 2 is shown schematically; however, it will be apparent to one skilled in the art that in achieving maximum photothermal conversion and heat transfer such variations as the use of an optical concentrator or modifications in heat exchange sizes may be found advantageous.

The absorber 2 may be tailored for most efficient transfer of the source of energy 1 to the material 3.

In the case of simple heat the properties of good thermal conduction accompanied by a melting point higher than the operating temperatures are desirable. The material tungsten is satisfactory. In the case of radiant energy in addition to a melting point above the operating temperature, the property of good photothermal conversion for the specifications of the energy source is desirable. The absorptance, usually identified by the symbol $\alpha$ should be close to 1 for near normal incidence radiation, while the hemispherical emittance, usually identified in the art by the symbol ε, should be close to 0 as possible. Such a condition can be approximated in a structure made of refractory metal needles with the needles pointed in the direction of the incident light. One such material is dendritic tungsten, described in the *IBM Journal of Research and Development,* Vol. 22, No. 4, July 1978, p. 372.

The material of the storage material 3 has the properties of high thermal conductance, high latent heat of fusion and high melting point. For good electrical conversion at the melting point, about 10% of the black body radiation in the high photon energy portion will be absorbed by the photovoltaic cell 7 of FIG. 1. High melting point metals will satisfy these conditions quite well. The element iron is particularly satisfactory, having a melting temperature of 1536° C., a latent heat of fusion of 3.67 kilocalories per gram atom and a thermal conductance of 0.18 calories/cm$^2$/cm/degree/second, at room temperature. A gram atom of Fe is 55.8 grams. Another material is the element Si with a melting temperature of 1410° C., a latent heat of fusion of 11.1 kilocalories per gram atom and a thermal conductance of 0.2 calories/cm$^2$/cm/degree/second at room temperature. A gram atom of Si is 28.1 grams.

The storage material 3 is encased in a container 4 which is provided with the properties of low coefficient of heat transfer and low emissivity so that there is maximum retention of heat. Since high melting point metals may involve temperatures above 1800° K. the material of the container 4 will probably be of a refractory type such as boron nitride or aluminum oxide and may, in turn, be further surrounded by a reflective evacuated chamber, not shown. Since the goal of the invention is to retain all energy within the housing that is shown schematically as element 4, except for that which is permitted to escape through controlled conditions produced by the interdependent properties of elements 5, 6 and 7, it will be apparent that the thermal retention properties of element 4 to a large measure, will effect the efficiency of the system.

Where the source energy 1 is of an intermittent nature, such as solar energy or where an off-duty cycle is desired, the efficiency of the housing 4 may be enhanced by the provision of a device such as a heat mirror, not shown in FIG. 1 which would operate to prevent radiation loss from any opening and thereby prevent loss of energy. In the radiant energy type of application this would occur as the strength of the radiant energy becomes lower than that of the energy radiated by the absorber 2 which is thermally coupled to the storage material 3, such as may occur in solar applications with the approach of and during night. In a type of application where the invention is used as a portable power supply for a vehicle or a standby power supply for a piece of equipment, once an adequate energy storage for the purpose is complete, the container 4 could be closed and only loss of energy need be periodically supplied.

The energy, once it is stored in the material 3, is controllably released by emission in a wavelength band as illustrated in FIG. 3 and it is further only a portion of that band that photovoltaic devices of the type available at this point in the art are able to respond with efficiency.

The efficiency of such photovoltaic devices can be further enhanced by narrowing the emission until the photon energy is just greater than the band gap energy of the material of the photovoltaic device. With this approach, efficiencies over 50% are achievable in contrast to the maximum at the present state of the art of about 26%.

In accordance with the invention, a narrow band of photon energies, just above the energy band gap of the photovoltaic cell 7, is selected for release by an interdependent combination of a directional thermal to radiant energy emitter 5, a band pass filter 6 and a photovoltaic cell 7 which are arranged such that the emitter 5 converts the thermal energy to radiant energy with some direction. Only those photons shown by the schematic arrow 8 which would be at the peak responsiveness wavelength of the photovoltaic cell 7 would be permitted to pass through the filter 6 and all others illustrated as arrow 9 are returned and re-absorbed by the emitter 5 and thus do not contribute to heat loss.

The thermal to radiative energy emitter 5 to be directional should have the property that the total hemispherical emittance, usually identified in the art by the symbol ε, is at a value of nearly 1 in a direction normal to the surface and is at a value nearly 0 for all other directions. An example of a material that approximates this condition is dendritic tungsten as described in the *IBM Journal of Research and Development,* Vol. 22, No. 4, July 1978, p. 372 with the needles pointed in the direction of emission.

Band pass filters of the type required for band pass filter 6 are well known in the art and are commercially available. Such filters have the property that if a wide band of radiation is normally incident thereon, only a small preselected range of wavelengths will be transmitted, while the remaining radiation will be reflected. For the example where the material 3 is molten iron at about 1800° K. and the photovoltaic cell 7 is silicon, then the band pass filter 6 will be designed to transmit and thereby release photons shown as 8 in FIG. 1 having an energy range within 1.1–1.6 electron volts and to reflect all others shown as 9 in FIG. 1 back into the material 3.

One group of band pass filters well known in the art have been made up of multiple dichroic layers. The layers are dielectric, each with a different index of refraction that in combination provide transparency only in a narrow range. Dielectric materials $SiO_2$, $TiO_2$, $ZnO$, $Al_2O_3$, $Si_3N_4$, and TaO are useable. Another type of filter uses a semiconductor window with a band energy gap of the appropriate value together with proper reflectors. The filter 6 should permit only about 10% of the photons, only those having energies in the maximum energy response range of the photovoltaic device 7 to pass so that photons emitted in a straight line from the emitter 5 pass through the filter 6 whereas most all other photons are reflected back and are retained inside the container and thus do not contribute to energy loss.

Positioned with good optical coupling to the filter 6 is an efficient photovoltaic converter 7 such as the V-groove multijunction silicon solar cell described in *The IEEE Transactions on Electron Devices,* Vol. ED-26, July 1979, pp. 1090 to 1097. The selection of the photovoltaic cell 7 is affected by the melting temperature of material 3, the energy band gap of the material of the photovoltaic cell 7 and the directionality and narrowness of the band of photon energies 8 that emanate from the combination of the emitter 5 and the band pass filter 6.

Figure 4:
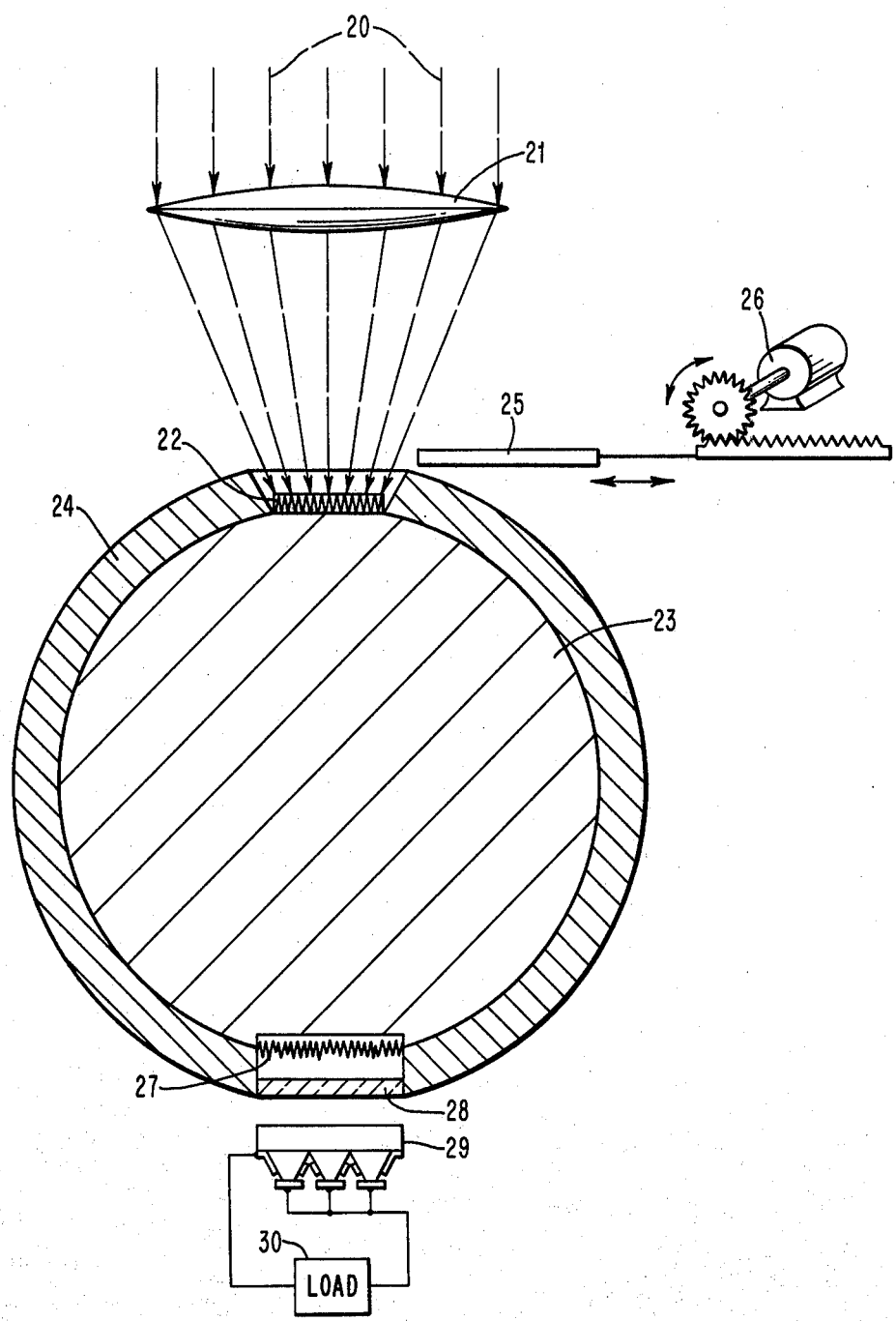
FIG. 4 is a schematic of an energy storage and conversion system for solar to electrical energy.

Referring next to FIG. 4, an embodiment of a system of the energy storage of the invention is illustrated for conversion of the daily energy of the sun into continuous electrical power.

In FIG. 4, solar energy 20 is provided through a concentrator lens 21 which focuses, at a concentration ratio of approximately 500 to 2000 times onto an absorber 22 having properties such that the absorptance property, usually identified in the art by the symbol α, is at a value of 1 and the hemispherical emittance property, usually identified in the art by the symbol ε, is at a value of equal to or less than 0.2. The absorber 22 provides transfer of the radiant energy 20 into a thermal energy in storage material 23.

The material dendritic tungsten with the needles toward the source of radiant energy satisfies the α and ε criteria for the absorber 22.

The heat insulating container 24 is shown spherical since the spherical shape gives minimum surface area to volume and hence minimum area to insulate.

The energy storage material 23 is positioned in the container 24 and has the properties of not being rare or costly, of having a high latent heat of fusion, a high thermal conductance, and a high melting temperature at which about 10% of the black body radiation thereof will be in the high photon energy range absorbable by a photovoltaic cell. The materials iron and silicon each satisfy these properties.

A member 25 is provided to prevent radiation out of the opening in the insulating container under conditions such as when the sun goes down. The member 25 is a heat mirror positioned by movement apparatus 26 shown as a motor and gear arrangement to cover the absorber 22 opening. A similar structure can be provided to control emission from any opening.

At a point in time such as when the sun is down or when the release to the load should be interrupted, the apparatus 26 moves the mirror 25 over the opening.

For simplicity of illustration purposes, the container 24 is shown of a single material such as, for example, boron nitride and aluminum oxide, the properties of which are good heat insulation and low emissivity. In fact, however, the higher the retention properties of the container 24, the greater will be the efficiency of the entire system so that the container 24 may further be surrounded with an evacuated container or other structure. Accommodation may also be necessary for pressure change and expansion. This would be of particular importance if the material 23 were to be operated using the property of the latent heat of vaporization. The preferred type of operation employs the latent heat of melting because of the radiative characteristic advantages of FIG. 3. The energy stored by melting the storage material 23 is selectively let out during freezing of the material 23 at the maximum efficiency of a photovoltaic cell 29 and for maximum use in a load 30 arrangement.

When the sun is the source of radiant energy, the amount of material 23 that will be needed will depend on the energy density impinging on absorber 22 during available time, i.e., the daylight, and the electrical energy to be continuously delivered to the load 30. The quantity of material 23 is chosen such that for a particular day at dawn, the material 23 would be almost entirely frozen whereas at dusk it would be almost entirely molten.

The system preferably uses the latent heat of fusion of material 23 and remains at a constant melting point temperature. The relative fraction that is molten will depend upon the cumulative energy received minus the energy that is delivered or lost. Appropriate safety factors for variations in supply and load should be included. The quantity of material 23 should be sufficient that it is never completely molten. The system is then prevented from overheating and thereby being damaged if not designed for it. Where the latent heat of vaporization is employed, the available heat storage capacity is greater but structural designs to handle pressures and temperatures must be modified.

The controlled energy release structure made up of the combination of the photovoltaic cell, the band pass filter and the directional thermal to radiant energy may be assembled as an aligned stack for good optical coupling and minimum loss but high thermal temperatures should be kept from the photovoltaic device 29 because of the temperature effect on semiconductor performance and specifications regarding heat on any dichroic material in the filter 28 should not be exceeded.

The photovoltaic converter 29 should have a maximum efficiency response that is tailored to the energy of the photons coming out of the band pass filter 28. The V-groove solar cell uses silicon that responds to photons having an energy from 1.1 to 1.6 electron volts. It involves multiple internal reflections and provides very high efficiency. Under conditions where the properties of emitter 27 and filter 28 are such that only photons in the responsive range are transmitted, the V-groove multijunction solar cell is expected to convert at an efficiency greater than 50% and the total conversion efficiency of the storage system will be in the vicinity of 40%.

The material 3 will remain continuously at the melting temperature whether the amount of heat coming in is exceeding that released and the molten portion is increasing or the opposite condition where more heat is being released than is coming in and the molten portion is decreasing.

The following examples are an illustration of system performance using as an assumption for a solar energy application an eight hour average daily sunlight period and using a 1-square meter concentrator lens 21 which provides 1 kilowatt impinging on absorber 22 for 8 hours which provides 8 kilowatts per day. Where the material 23 is iron (Fe), with a melting temperature ($T_m$) of 1536° C., an atomic weight of 55.8 grams/cc, a density ($\rho$) of 7.87 gms/cc, a latent heat of fusion ($\Delta H_f$) of 3.67 kilocalories/mole and a thermal conductance of 0.18 calories/cm²cm/degree/second, at room temperature, then for 8 kilowatt hours of storage there will be required 106 kilograms or 233 lbs., occupying a volume of 13.5 liters which in turn is a containment sphere of radius 14.7 centimeters.

Where the material is silicon (Si) with a melting temperature ($T_m$) of 1410° C., an atomic weight of 28.1, a density ($\rho$) of 2.35, a latent heat of fusion ($\Delta H_f$) of 11.1 kilocalories per mole and a thermal conductivity of 0.2 calories/cm²/cm/degree/second, at room temperature, then for 8 hours of storage there will be required 14.7 kilograms or 38 lbs., occupying a volume of 7.41 liters which in turn is a containment sphere of radius 12.0 centimeters.

The 8 Kw energy stored in the 14.7 or 12.0 cm radius sphere of Fe or Si, respectively, at an assumed temperature of the vicinity of 1800° K. is selectively released as photons with an energy that is in the responsive range of a photovoltaic cell through the use of a thermal to radiant energy emitter 27 and band pass filter 28 combination. This type of energy transfer can be approximated in practice by using dendritic tungsten with the needles in the direction of emission as the emitter 27 positioned in a tandem arrangement with a band pass filter 28 made up of an intrinsic semiconductor window with a band gap energy corresponding to the desired high photon energy cutoff of responsiveness of the photovoltaic device 29 that is coated with a transparent reflective layer such as a dielectric oxide and a heat mirror such as glass coated with a conductive oxide such as tin oxide. The reflective layer on the semiconductor window and the heat mirror in combination operate to reflect photons that have either too high or too low an energy to be passed by the semiconductor window. For a photovoltaic device 29 with peak efficiency responsiveness to photons in the 1.1 to 1.6 electron volt range, the semiconductor window could be a cadmium telluride (CdTe) crystal 50 mils thick or a hydrogenated amorphous silicon layer ($\alpha$-Si:H) 10 mils thick, coated with 1300 to 1600 Å of $SiO_2$ or $TiO_2$ in tandem with and preceded by a heat mirror of SnO coated glass.

An emitter 27 of dendritic tungsten at 1800° K. would be emitting 75 watts/$cm^2$ with a hemispherical emissivity of 1 but with an assumed average emissivity of 0.2 it would emit 15 watts/$cm^2$. Assuming the area of the emitter 27 to be 200 $cm^2$, there will be 3000 watts emitted and the band pass filter 28 will reflect 2700 watts that do not have the correct range of photon energy. The 300 watts that are passed represent 7.2 Kwh over 24 hours or a loss of 0.8 Kwh in the storage portion of the system. The 300 watts are converted in the V-groove multijunction photovoltaic device 29 at a 50% efficiency, providing 3.6 Kwh over a 24 hour day. Thus, a sphere approximately 10 inches in diameter will store in 8 hours enough energy to supply a ½ horsepower motor for 24 hours with approximately a light input through a concentrator 100 cm on a side and a photovoltaic device output that is about 14 cm on a side.

In a situation where there is a variable electrical load connected to cell 29, some energy efficiency accommodation can be provided with an optical imaging system with a reflective diaphram interposed between filter 28 and cell 29 to recycle excess photons during low demand periods. Alternatively, electrical power could be fed back into material 23 from cell 29 resistively as heat in low demand load periods or the opening could be controlled through an apparatus similar to 25 and 26.

What has been described is a system of buffering and converting energy so as to provide for multiple energy types, in densities and durations at the input and multiple types of output of selectable duration and intensity.

Having described the invention, what is claimed as new and what is desired to secure by Letters Patent is:

1. An energy system comprising in combination:
a thermally insulated energy storage container;
an energy storage material within said container,
  said energy storage material having the combined characteristics of:
    a thermal conductance in excess of 0.1 calorie per square centimeter per centimeter per degree per second at room temperature,
    a latent heat of fusion of the order of 1 Kilocalorie per mole, and
    a melting point in the vicinity of 1300° Kelvin and above;
energy input means for delivering source energy outside said container as thermal energy to said material; and
energy output release means for delivering a portion of the energy stored in said material to a load under conditions responsive to the requirements of said load.

2. The system of claim 1 wherein said container is spherical.

3. The system of claim 1 wherein said energy input means is a radiant energy to thermal energy converter.

4. The system of claim 3 wherein said energy output release means includes a thermal energy to a selected optical energy wavelength band converter.

5. The system of claim 4 wherein said energy output release means includes a photovoltaic device having high efficiency response at said selected optical energy wavelength band.

6. The system of claim 5 wherein said energy storage material is a member of the group of iron, silicon, manganese, chromium and titanium.

7. The system of claim 1 wherein said energy output release means includes a thermal energy to a selected optical energy wavelength band converter.

8. An energy system comprising in combination:
thermally insulated energy storage confinement means;
energy storage material within said confinement means, said material having the combined characteristics of a thermal conductance in excess of 0.1 calorie per square centimeter per centimeter per degree per second at room temperature, a latent heat of fusion of the order of 1 kilocalorie per mole and a melting point in the vicinity of 1300° Kelvin and above;
energy input means for delivering source energy outside said container as thermal energy to said material; and
energy output release means for delivering a portion of the energy from said material to said load under conditions responsive to the requirements of said load.

9. The system of claim 8 wherein said energy input means is a radiant energy to thermal energy converter.

10. The system of claim 9 wherein said thermal energy converter is dendritic tungsten.

11. The system of claim 9 wherein said energy output release means includes a thermal energy to a selected optical energy wavelength band converter.

12. The system of claim 11 wherein said thermal energy to optical energy converter includes a thermal to radiant energy emitter optically coupled to a selected photon energy transmitting member.

13. The system of claim 12 wherein said transmitting member is a band pass filter.

14. The system of claim 12 wherein said transmitting member is a selected photon energy passing semiconductor window with associated non-selected energy reflecting members.

15. The system of claim 8 wherein said energy output release means includes a thermal energy to a selected optical energy wavelength band converter.

16. The system of claim 15 wherein said output means also includes a photovoltaic converter efficiently responsive and optically coupled to said converter.

17. The system of claim 16 wherein said energy storage material is a member of the group of iron, silicon, manganese, chromium and titanium, said input means includes a dendritic tungsten absorber positioned with the dendritic needles in the direction of said radiant energy, said energy release means includes a dendritic tungsten emitter positioned with the needles away from said storage material, a 1.1 to 1.6 electron volt photon band pass filter optically coupled to said emitter, and a V-groove multijunction solar cell optically coupled to said band pass filter.

18. In an energy conversion system of the type wherein energy supplied by a source having intensity and/or duration variation is to be connected to a load having a varying magnitude and/or duration of energy usage the improvement comprising:

means for delivering energy from said source as thermal energy to a storage member,
    said storage member being a material having the combined characteristics of
        a thermal conductance in excess of 0.1 calorie per square centimeter per centimeter per degree per second at room temperature,
        a latent heat of fusion of the order of 1 Kilocalorie per mole and
        a melting point in the vicinity of 1300° Kelvin and above,
means delivering radiation from said storage member to an optically coupled photovoltaic member, and
means connecting the output of said photovoltaic member to said load.

19. The system of claim 18 wherein said material is a member of the group of iron, silicon, manganese, chromium and titanium.

* * * * *